United States Patent
Chun et al.

(10) Patent No.: US 8,664,016 B2
(45) Date of Patent: Mar. 4, 2014

(54) ORGANIC LIGHT EMITTING DIODE AND METHOD OF MANUFACTURING THE SAME

(75) Inventors: Min-Seung Chun, Yongin (KR); Mi-Kyung Kim, Yongin (KR); Dong-Heon Kim, Yongin (KR); Jung-Ha Son, Yongin (KR); Jae-Hyun Kwak, Yongin (KR); Kyung-Hoon Choi, Yongin (KR); Mie-Hwan Park, Yongin (KR); Young-Ho Park, Yongin (KR); Young-Suck Choi, Young (KR); Tae-Shick Kim, Yongin (KR); Choon-Woo Im, Yongin (KR); Kwan-Hee Lee, Young (KR)

(73) Assignee: Samsung Display Co., Ltd., Yongin-si (KR)

( * ) Notice: Subject to any disclaimer, the term of this patent is extended or adjusted under 35 U.S.C. 154(b) by 185 days.

(21) Appl. No.: 12/686,594

(22) Filed: Jan. 13, 2010

(65) Prior Publication Data

US 2010/0176389 A1 Jul. 15, 2010

(30) Foreign Application Priority Data

Jan. 13, 2009 (KR) .................. 10-2009-0002705

(51) Int. Cl.
*H01L 51/56* (2006.01)
*H01L 51/50* (2006.01)
*H01L 51/54* (2006.01)

(52) U.S. Cl.
USPC ............ 438/22; 438/45; 438/99; 257/13; 257/79; 257/E51.022; 257/E51.018

(58) Field of Classification Search
USPC .......... 438/22, 29–32, 45, 99, 761, 763, 778, 438/780–785; 118/723 E, 723 ER; 427/248.1, 255.5–255.7; 257/13, 79, 257/86, 88–90, E51.022, E51.001, 257/E51.018, E51.026, E33.001, E31.099, 257/E31.105, E21.091–E21.103
See application file for complete search history.

(56) References Cited

U.S. PATENT DOCUMENTS 4,356,429 A 10/1982 Tang
5,953,587 A * 9/1999 Forrest et al. ............... 438/99

(Continued)

FOREIGN PATENT DOCUMENTS

JP 2009-188045 8/2009
KR 10-2006-0104670 10/2006

(Continued)

OTHER PUBLICATIONS

Abstract of Korean Publication No. 1020060055765.

(Continued)

*Primary Examiner* — Laura Menz
*Assistant Examiner* — Maliheh Malek
(74) *Attorney, Agent, or Firm* — Christie, Parker & Hale, LLP

(57) ABSTRACT

Provided are an organic light emitting diode and a method of manufacturing the same. The organic light emitting diode adjusts an optical resonance thickness and prevents spectrum distortions without use of an auxiliary layer. The organic light emitting diode includes a first electrode that is optically reflective; a second electrode that is optically transmissible and faces the first electrode; an organic emission layer interposed between the first electrode and the second electrode, the organic emission layer including: a first emission layer including a mixed layer that contains a host material and a dopant material, and a second emission layer comprising only the host material; and a carrier injection transport layer interposed between the organic emission layer and the first electrode or between the organic emission layer and the second electrode.

9 Claims, 6 Drawing Sheets

(56) References Cited

U.S. PATENT DOCUMENTS

| | | | |
|---|---|---|---|
| 6,224,448 B1* | 5/2001 | Tada et al. | 445/24 |
| 6,237,529 B1* | 5/2001 | Spahn | 118/726 |
| 6,255,775 B1* | 7/2001 | Ikuko et al. | 313/506 |
| 6,776,847 B2* | 8/2004 | Yamazaki et al. | 118/724 |
| 6,965,198 B2* | 11/2005 | Haase et al. | 313/506 |
| 7,153,180 B2* | 12/2006 | Cok et al. | 445/58 |
| 7,214,554 B2* | 5/2007 | Winters et al. | 438/21 |
| 7,236,845 B2* | 6/2007 | Ludwicki et al. | 700/106 |
| 7,615,501 B2* | 11/2009 | Haase et al. | 438/780 |
| 7,768,194 B2* | 8/2010 | Forrest et al. | 313/504 |
| 7,794,857 B2* | 9/2010 | Tanabe et al. | 428/690 |
| 7,892,878 B2* | 2/2011 | Lee et al. | 438/82 |
| 7,902,085 B2* | 3/2011 | Chung et al. | 438/780 |
| 7,943,443 B2* | 5/2011 | Yamazaki et al. | 438/155 |
| 2001/0036691 A1* | 11/2001 | Kitazume et al. | 438/160 |
| 2002/0009538 A1* | 1/2002 | Arai | 427/66 |
| 2002/0176930 A1* | 11/2002 | Peng | 427/58 |
| 2003/0072876 A1* | 4/2003 | Chung | 427/248.1 |
| 2003/0124764 A1* | 7/2003 | Yamazaki et al. | 438/99 |
| 2004/0135160 A1* | 7/2004 | Cok | 257/88 |
| 2005/0016462 A1* | 1/2005 | Yamazaki | 118/726 |
| 2005/0084994 A1* | 4/2005 | Yamazaki et al. | 438/99 |
| 2005/0208205 A1* | 9/2005 | Haase et al. | 427/66 |
| 2005/0208698 A1* | 9/2005 | Winters et al. | 438/99 |
| 2006/0222888 A1 | 10/2006 | Lee et al. | |
| 2006/0279203 A1* | 12/2006 | Forrest et al. | 313/504 |
| 2007/0020483 A1* | 1/2007 | Park et al. | 428/690 |
| 2007/0072337 A1* | 3/2007 | Matsuzaki et al. | 438/99 |
| 2007/0096125 A1* | 5/2007 | Vogel et al. | 257/89 |
| 2007/0178708 A1* | 8/2007 | Ukigaya | 438/758 |
| 2008/0286610 A1* | 11/2008 | Deaton et al. | 428/704 |
| 2009/0033212 A1* | 2/2009 | Ahn et al. | 313/504 |
| 2009/0039769 A1* | 2/2009 | Matsunami et al. | 313/504 |
| 2009/0075411 A1* | 3/2009 | Yamazaki et al. | 438/29 |
| 2009/0081365 A1* | 3/2009 | Cok et al. | 427/255.6 |
| 2009/0096352 A1* | 4/2009 | Spindler et al. | 313/504 |
| 2009/0108736 A1* | 4/2009 | Begley et al. | 313/504 |
| 2009/0110957 A1* | 4/2009 | Begley et al. | 428/690 |
| 2009/0146552 A1* | 6/2009 | Spindler et al. | 313/504 |
| 2009/0167158 A1* | 7/2009 | Kathirgamanathan et al. | 313/504 |
| 2009/0191428 A1* | 7/2009 | Hatwar et al. | 428/690 |
| 2009/0226757 A1 | 9/2009 | Song et al. | |
| 2009/0232976 A1* | 9/2009 | Yoon et al. | 427/157 |
| 2009/0243471 A1 | 10/2009 | Kawamura et al. | |
| 2009/0293808 A1* | 12/2009 | Yamazaki | 118/722 |
| 2010/0066239 A1* | 3/2010 | Spindler et al. | 313/504 |
| 2010/0090202 A1* | 4/2010 | Obata et al. | 257/40 |
| 2010/0123150 A1* | 5/2010 | Anandan | 257/98 |
| 2010/0224859 A1* | 9/2010 | Gough et al. | 257/13 |
| 2010/0297349 A1* | 11/2010 | Lee et al. | 427/248.1 |
| 2010/0298607 A1* | 11/2010 | Park et al. | 564/427 |
| 2011/0033973 A1* | 2/2011 | Cok et al. | 438/99 |
| 2011/0062427 A1* | 3/2011 | Jeong et al. | 257/40 |
| 2011/0068327 A1* | 3/2011 | Morishima | 257/40 |
| 2011/0084259 A1* | 4/2011 | Lee et al. | 257/40 |
| 2011/0127511 A1* | 6/2011 | Park et al. | 257/40 |
| 2011/0165327 A1* | 7/2011 | Park et al. | 427/248.1 |
| 2011/0203667 A1* | 8/2011 | Liao et al. | 136/263 |
| 2011/0204385 A1* | 8/2011 | Tyan et al. | 257/79 |
| 2011/0217802 A1* | 9/2011 | Yamazaki et al. | 438/34 |
| 2011/0220877 A1* | 9/2011 | Morishima | 257/40 |
| 2013/0032829 A1* | 2/2013 | Sung et al. | 257/88 |

FOREIGN PATENT DOCUMENTS

| | | |
|---|---|---|
| KR | 10-0669775 | 1/2007 |
| KR | 10-2009-0095022 | 9/2009 |

OTHER PUBLICATIONS

Korean Office Action issued Mar. 29, 2010, in corresponding Korean Patent Application No. 10-2009-0002705.

Korean Registration Determination Certificate dated Oct. 19, 2010, issued in corresponding Korean Patent Application No. 10-2009-0002705.

* cited by examiner

ORGANIC LIGHT EMITTING DIODE AND METHOD OF MANUFACTURING THE SAME

CROSS-REFERENCE TO RELATED APPLICATION

This application claims the benefit of Korean Patent Application No. 10-2009-0002705, filed Jan. 13, 2009 in the Korean Intellectual Property Office, the disclosure of which is incorporated herein by reference.

BACKGROUND OF THE INVENTION

1. Field of the Invention

Aspects of the present invention relate to an organic light emitting diode and a method of manufacturing the same, and in particular, to an organic light emitting diode including an improved emission layer and a method of manufacturing the same.

2. Description of the Related Art

Organic light emitting devices display an image toward, in addition to a bottom surface thereof, a top surface thereof. For top-emission type organic light emitting devices, pixel circuits connected to pixels are disposed in the opposite direction to a direction in which an image is displayed and thus, a degree of freedom in a pixel circuit design is high. Thus, research into top-emission type organic light emitting devices is being actively performed in various aspects.

However, top-emission type organic light emitting devices use an optical resonance structure between a reflective anode and a semi-transmissible cathode to increase light extraction efficiency. Due to the use of the optical resonance structure, an optimal thickness of an organic film between an anode and a cathode is dependent upon an emission wavelength. Thus, pixels have different thicknesses due to the organic film thickness that is dependent upon emission color, and the stacking structure of organic films becomes complex. For example, since a blue pixel has a shorter wavelength of light emission spectrum than a red or green pixel, the thickness of the organic film in the blue pixel is smallest and then, the green pixel and then, the red pixel. That is, the red pixel includes the thickest organic film, whereas the green pixel has a thickness between that of the red and blue pixels.

Conventionally, in pixels of various colors, for red and green pixels, an auxiliary layer is further added to the organic film to adjust the thickness according to an emission wavelength. That is, one more operation is further required than when the blue pixel is manufactured. Thus, the operating time is increased and a chamber arrangement becomes complex.

To solve this problem, instead of the auxiliary layer, the thickness of other functional layers can be increased. Examples of such common functional layers include a hole injection transport layer or an electron injection transport layer. However, when the thickness of these common functional layers is changed, characteristics of other colors may be changed.

Instead of these methods, the thickness of an emission layer can be increased by a size corresponding to the thickness of the auxiliary layer. However, when the thickness of the emission layer is increased, the distance between an emission region and a reflective film of an anode is reduced. Thus, an original spectrum may not be obtained and color coordinates are distorted. In addition, where there is the increase in emission layer thickness, the light emitted outside a device may have different spectrum regions and luminescent efficiency may also be reduced.

SUMMARY OF THE INVENTION

Aspects of the present invention provide an organic light emitting diode capable of adjusting an optical resonance thickness and preventing spectrum distortions without use of an auxiliary layer, a method of manufacturing the same, and a machine for manufacturing the same.

According to an aspect of the present invention, there is provided an organic light emitting diode including: a first electrode that is optically reflective; a second electrode that is optically transmissible and faces the first electrode; an organic emission layer interposed between the first electrode and the second electrode, the organic emission layer including: a first emission layer including a mixed layer that contains a host material and a dopant material, and a second emission layer including only the host material; and a carrier injection transport layer interposed between the organic emission layer and the first electrode or the second electrode.

According to an aspect of the invention, the organic emission layer may further include a third emission layer including the mixed layer that contains the host material and the dopant material.

According to an aspect of the invention, the second emission layer may be interposed between the first emission layer and the third emission layer.

According to an aspect of the present invention, there is provided an organic light emitting diode including: a first electrode that is optically reflective; a second electrode that is optically transmissible and faces the first electrode; an organic emission layer interposed between the first electrode and the second electrode, the organic emission layer including: at least two first emission layers each including a mixed layer that contains a host material and a dopant material, and at least one second emission layer including only the host material, wherein the first emission layer and the second emission layer are alternatively stacked; and a carrier injection transport layer interposed between the organic emission layer and the first electrode or the second electrode.

According to an aspect of the invention, the organic emission layer comprises three first emission layers and two second emission layers.

According to an aspect of the present invention, there is provided a method of manufacturing an organic light emitting device, wherein the method includes: preparing a substrate on which a first electrode that is reflective is disposed; preparing a first deposition source that discharges a host material for forming an emission layer of an organic light emitting diode toward the prepared substrate in a first deposition region, and a second deposition source that discharges a dopant material for forming an emission layer of an organic light emitting diode toward the prepared substrate in a second deposition region; adjusting the first deposition source and the second deposition source to form a combined deposition region, wherein the combined deposition region includes an overlap region formed where the first deposition region and the second deposition region overlap; driving the first deposition source and the second deposition source to deposit the host material and the dopant material on the first electrode of the substrate, thereby forming an organic emission layer, wherein the organic emission layer includes a first emission layer including a mixed layer that contains the deposited host material and the deposited dopant material, and a second emission layer including only the deposited host material; and forming a second electrode that is optically transmissible on the formed organic emission layer.

According to an aspect of the invention, the first deposition region may include a portion outside of the overlap region and the overlap region.

According to an aspect of the invention, the method may further include preparing a third deposition source that discharges the dopant material in a third deposition region, wherein the combined overlap region includes: a first overlap region formed where the first deposition region and the second deposition region overlap, a second overlap region formed where the first deposition region and the third deposition region overlap, wherein the first deposition region includes a portion between the first overlap region and the second overlap region.

In the driving of the first deposition source and the second deposition source, the first deposition source and the second deposition source are simultaneously moved from an outside of an end of the substrate to the outside of another end of the substrate according to an aspect of the invention.

According to an aspect of the present invention, there is provided an organic light emitting diode including: a first electrode that is optically reflective; a second electrode that is optically transmissible and faces the first electrode; an organic emission layer interposed between the first electrode and the second electrode, the organic emission layer including a first stack and a second stack, each of the first and second stack including: a first emission layer including a mixed layer that contains a host material and a dopant material, and a second emission layer including only the host material, wherein an order of the first emission layer and the second emission layer in the first stack is other than an order of the first and second emission layers in the second stack; and a carrier injection transport layer interposed between the organic emission layer and the first electrode or the second electrode.

According to an aspect of the present invention, there is provided an organic light emitting diode including: a first electrode; a second electrode that faces the first electrode; and an organic emission layer interposed between the first electrode and the second electrode, the organic emission layer including: a first emission layer including a host material and a dopant material, and a second emission layer including only the host material.

According to an aspect of the present invention, there is provided a method of manufacturing an organic light emitting device, the method including: discharging a host material of an organic emission layer on a substrate at a first region; discharging a dopant material of the organic emission layer on the substrate at a second region; wherein the first and second regions at least partially overlap, and the discharging of the host material and the discharging of the dopant material are simultaneous.

According to an aspect of the present invention, there is provided a machine for manufacturing an organic light emitting device, the machine including: first and second deposition sources disposed adjacently on a base to discharge first and second deposition materials, respectively, onto a substrate; a first angle limitation member disposed between the first and second deposition sources to define adjacent angles at which the first and second deposition materials are discharged from the first and second deposition sources onto the substrate; a second angle limitation member disposed outside of the first deposition source to define a first outside angle at which the first deposition material is discharged from the first deposition source onto the substrate; and a third angle limitation member disposed outside of the second deposition source to define a second outside angle at which the second deposition material is discharged from the second deposition source onto the substrate, wherein the first and second angle limitation members together define a first deposition region on the substrate, wherein the first and third angle limitation members together define a second deposition region on the substrate, and wherein the first and second deposition regions at least partially overlap.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
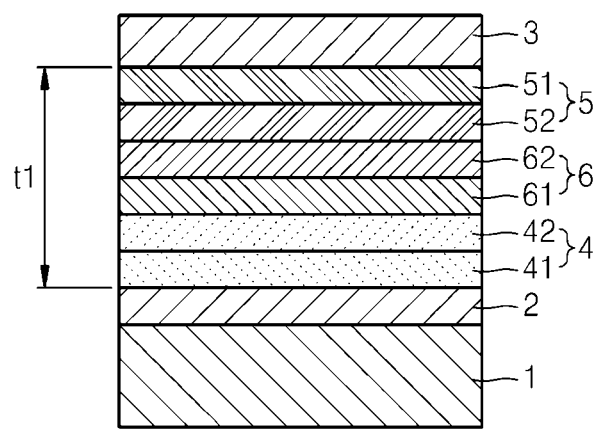
FIGS. 1 through 3 are schematic sectional views of Organic light emitting diodes according to embodiments of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a schematic sectional view of an organic light emitting diode according to an embodiment of the present invention. Referring to FIG. 1, a first electrode 2 and a second electrode 3 facing the first electrode 2 are disposed on a substrate 1. A first organic layer 4, an organic emission layer 6, and a second organic layer 5 are stacked in this order on the first electrode 2 between the first electrode 2 and the second electrode 3.

The substrate 1 may be a glass substrate but is not limited thereto. For example, the substrate 1 may be a plastic substrate or a metal substrate.

Although not illustrated, a pixel circuit unit including a plurality of thin film transistors may be formed between the substrate 1 and the first electrode 2. The pixel circuit unit may be allocated to each pixel, and may be electrically connected to the first electrode 2 in each pixel.

The first electrode 2 formed on the substrate 1 may be allocated to each pixel. The first electrode 2 may be a reflective electrode. For example, the first electrode 2 may include a reflective layer formed from an alloy of Al or Ag.

If the first electrode 2 acts as an anode, the first electrode 2 may include a layer formed from metal oxide having a high work function absolute value, such as ITO, IZO, or ZnO. If the first electrode 2 acts a cathode, the first electrode 2 may include a highly conductive metal having a low work function absolute value, such as Ag, Mg, Al, Pt, Pd, Au, Ni, Nd, Ir, Cr, Li, or Ca. In this case, the reflective layer as described above is not useful.

The second electrode 3 may be an optically transmissible electrode. In this case, the second electrode 3 may include: a semi transmissible reflective layer formed of Ag, Mg, Al, Pt, Pd, Au, Ni, Nd, Ir, Cr, Li, or Ca; or a light transmissible metal oxide such as ITO, IZO, or ZnO. If the first electrode 2 acts as an anode, the second electrode 3 acts as a cathode, and if the first electrode 2 acts as a cathode, the second electrode 3 acts as an anode.

The first organic layer 4 may be formed as a common functional layer on the first electrode 2. As shown, the first organic layer 4 includes at least one layer selected from a hole injection layer 41 and a hole transport layer 42. The hole injection layer 41 may be selectively formed by vacuum heat depositing or spin coating a hole injection material. The hole injection material may be a phthalocyanine compound such as a copper phthalocyanine or a starburst type amine such as TCTA, m-MTDATA, or m-MTDAPB, which are disclosed in U.S. Pat. No. 4,356,429, the disclosure of which is incorporated by reference.

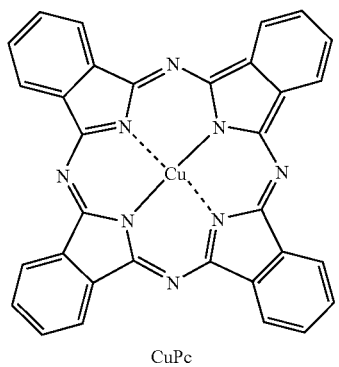

CuPc

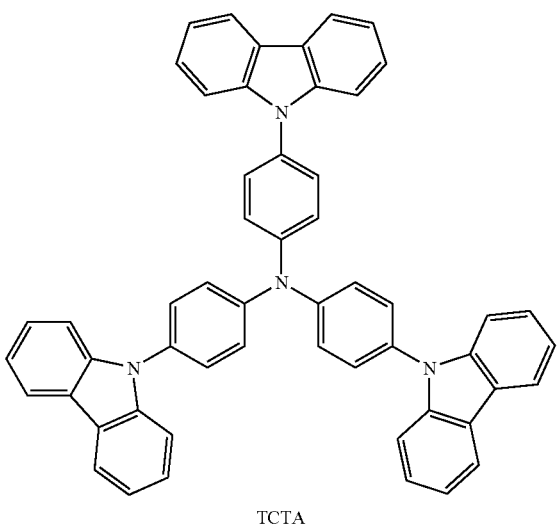

TCTA

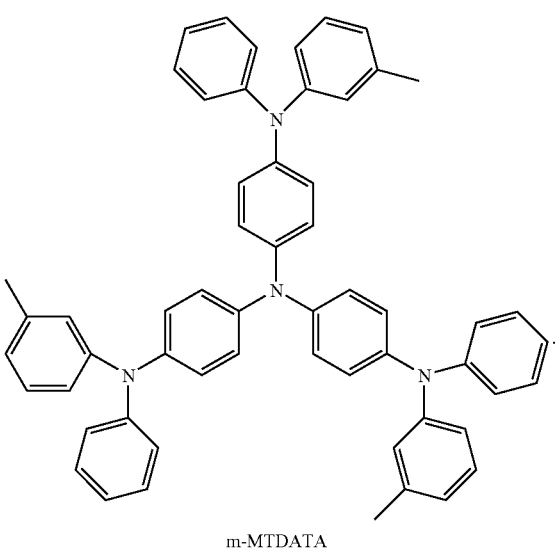

m-MTDATA

The hole transport layer 42 may be formed on the hole injection layer 41 using a hole transport layer material and a vacuum deposition method, a spin coating method, or a casting method. However, to easily obtain a uniform layer quality and also prevent formation of pin holes, use of the vacuum deposition method may be desired. When the hole transport layer 42 is formed using the vacuum deposition method, the deposition conditions may vary according to a compound used. However, in general, the deposition conditions may be similar to those used when the hole injection layer 41 is formed.

The hole transport layer material is not specifically limited, and may be, by way of example, N,N'-bis(3-methylphenyl)-N,N'-diphenyl-[1,1-biphenyl]-4,4'-diamine (TPD), or N,N'-di(naphthalene-1-yl)-N,N'-diphenyl benzidine (α-NPD).

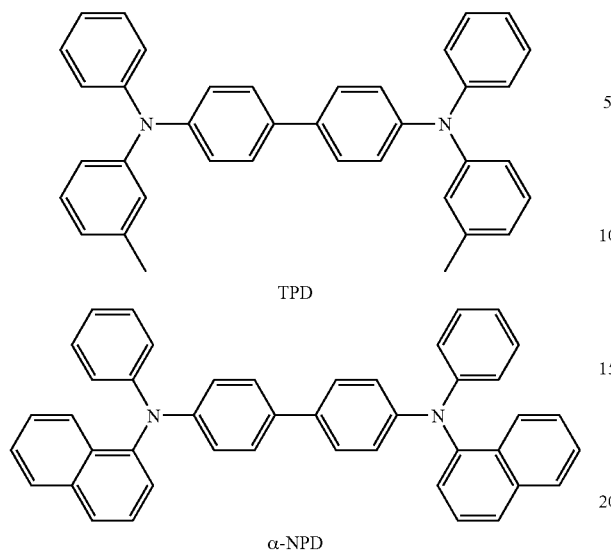

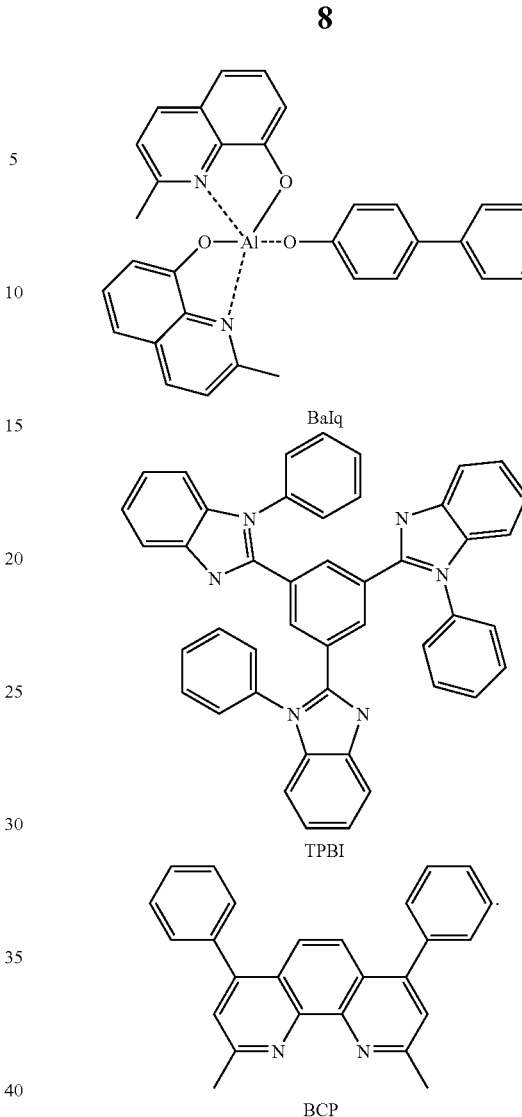

Subsequently, the organic emission layer 6 is formed on the first organic layer 4. The second organic layer 5 as another common functional layer is formed on the organic emission layer 6. As shown, the second organic layer 5 includes at least one layer selected from an electron injection layer 51 and an electron transport layer 52. However, the second organic layer 5 is not limited to the shown layers. Herein, either or both of the first and second organic layers 4 and 5 may be generically referred to as a carrier injection transport layer and may include additional layers or exclude layers herein described.

The electron injection layer 51 may include LiF, NaCl, CsF, $Li_2O$, BaO, or Liq. The thickness of the electron injection layer 51 may be in the range of 1 to 100, but is not limited thereto.

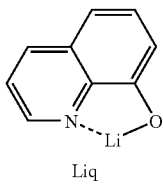

Liq

The electron transport layer 52 may be formed using a vacuum deposition method or a spin coating method. A material for forming the electron transport layer 52 may not be limited and may be $Alq_3$. The thickness of the electron transport layer 52 may be in the range of 50 to 600 nm, and may vary according to materials used to form other layers.

Although not illustrated, a hole blocking layer (HBL) may be selectively formed using a hole blocking material between the organic emission layer 6 and the electron transport layer 52. The hole blocking material used to form the HBL may not be limited, and may be a material having an electron transporting capability and higher ionization potential than an emission compound. The hole blocking material may be Balq, BCP, or TPBI:

Meanwhile, according to the shown example of the present invention, the organic emission layer 6 includes a first emission layer 61 and a second emission layer 62. The first emission layer 61 includes a mixed layer that contains a host material and a dopant material. The second emission layer 62 contains only a host material. The host material of the second emission layer 62 may be identical to the host material of the first emission layer 61, but need not be identical in all aspects.

In FIG. 1, the second emission layer 62 is formed on the first emission layer 61 such that the first emission layer 61 is between the second emission layer 62 and the first organic layer 4. However, the structure of the second emission layer 62 and the first emission layer 61 is not limited thereto. For example, the first emission layer 61 can be formed on the second emission layer 62 such that the second emission layer 62 is between the first emission layer 61 and the first organic layer 4.

The host materials of the first and second emission layers 61, 62 may be tris(8-hydroxy-quinolinato)aluminum (Alq3), 9,10-di(naphthy-2-yl)anthracene (AND), 3-Tert-butyl-9,10-di(naphthy-2-yl)anthracene (TBADN), 4,4'-bis(2,2-diphenyl-ethen-1-yl)-4,4'-dimethylphenyl (DPVBi), 4,4'-bisBis(2,2-diphenyl-ethen-1-yl)-4,4'-dimethylphenyl (p-DMDPVBi), Tert(9,9-diarylfluorene)s (TDAF), 2-(9,9'-spirofluorene-2- yl)-9,9'-spirofluorene (BSDF), 2,7-bis(9,9'-spirofluorene-2-yl)-9,9'-spirofluorene (TSDF), bis(9,9-diarylfluorene)s (BDAF), 4,4'-bis(2,2-diphenyl-ethen-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4''-tris(carbazole-9-yl)triphenylamine (TcTa), 4,4'-bis(carbazole-9-yl)biphenyl (CBP), 4,4'-bisBis(9-carbazoleyl)-2,2'-dimethyl-biphenyl (CBDP), 4,4'-bis(carbazole-9-yl)-9,9-dimethyl-fluorene (DMFL-CBP), 4,4'-bis(carbazole-9-yl)-9,9-bisbis(9-phenyl-9H-carbazole)fluorene (FL-4CBP), 4,4'-bis(carbazole-9-yl)-9,9-di-tolyl-fluorene (DPFL-CBP), or 9,9-bis(9-phenyl-9H-carbazole)fluorene (FL-2CBP).

The dopant material of the first emission layer 61 may be 4,4'-bis[4-(di-p-tolylamino)styryl]biphenyl (DPAVBi), 9,10-di(naph-2-tyl)anthracene (ADN), or 3-tert-butyl-9,10-di(naph-2-tyl)anthracene (TBADN).

In addition, unlike a case in which simply the total thickness of the organic emission layer 6 is increased, distortion of an image spectrum may be prevented.

Figure 2:
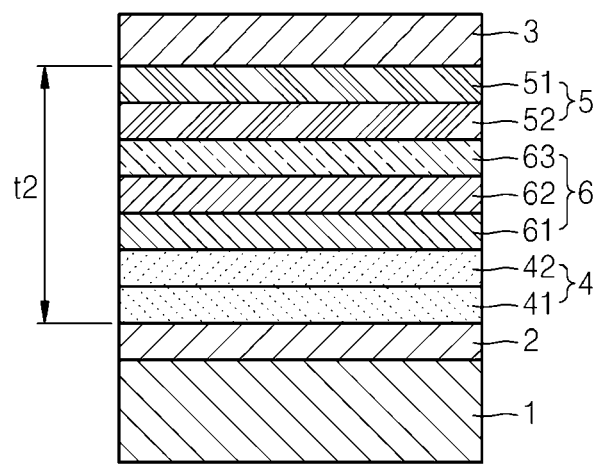

The structure of the organic emission layer 6 is more effective when the second emission layer 62, which contains only the host materials, is interposed between the first emission layer 61 and a third emission layer 63, as illustrated in embodiment shown in FIG. 2. The first emission layer 61 and the third emission layer 63 may be formed using the same material (i.e., the mixed layer), and the host material of the second emission layer 62 may be identical to the host materials of the first emission layer 61 and third emission layer 63. Even in this case, the interval between a top surface of the first electrode 2 and a bottom surface of the second electrode 3 may be adjusted to comply with a second resonance thickness t2 that is an optical resonance thickness. Detailed descriptions

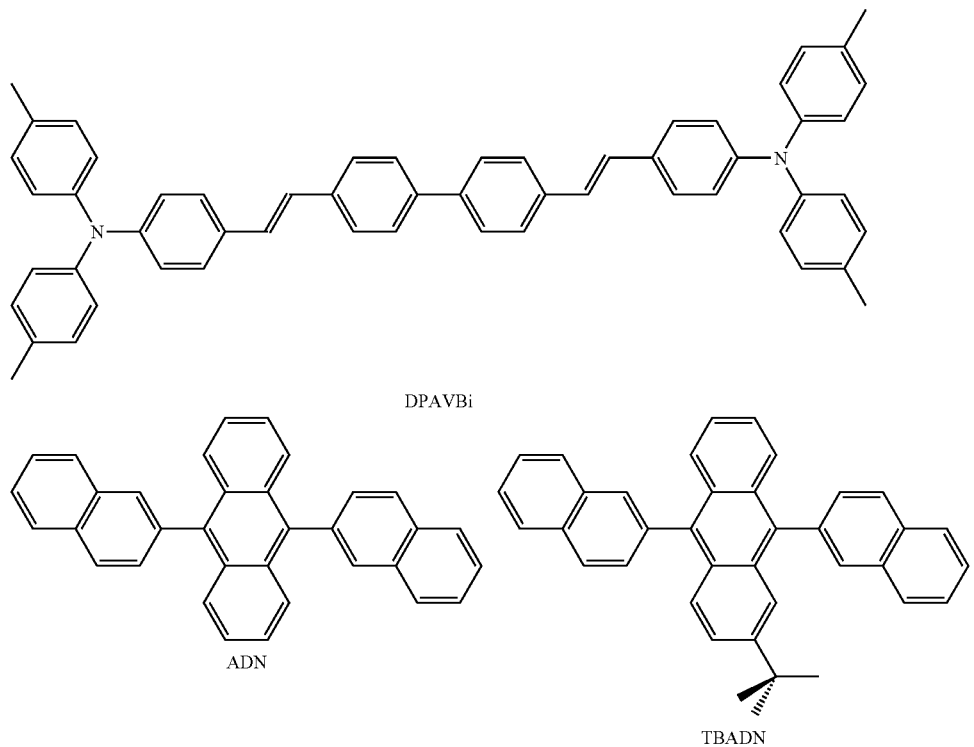

For the first emission layer 61, the host material and the dopant material may be simultaneously deposited using two deposition sources. In this case, the amount of the dopant material may vary according to a material used to form the emission layer 61. In general, the amount of the dopant material may be in the range of 3 to 20 parts by weight based on 100 parts by weight of the total weight of host and dopant materials for forming the first emission layer 61. If the amount of the dopant material is outside this range, luminescent characteristics of the organic light emitting diode may be degraded.

Since the organic emission layer 6 includes the first emission layer 61 including the mixed layer and the second emission layer 62 only the host material, the organic emission layer 6 may obtain a sufficiently high thickness without use of the auxiliary layer used in the conventional organic light emitting devices. Thus, as illustrated in FIG. 1, a first resonance thickness t1 is controllable.

of other layers have been already described with reference to FIG. 1 and thus, will not be presented herein.

As described in FIG. 2, in general, when a layer 62 that contains only a host material is disposed in the middle of the organic emission layer 6 that contains a host material and a dopant material in the first emission layer 61 and the third emission layer 63, excellent color coordinate characteristics, high optical efficiency, low driving voltage, and long lifetime may be obtained.

Figure 3:
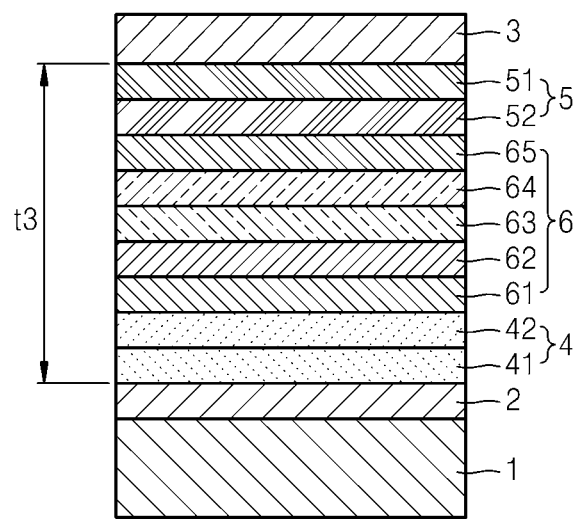

FIG. 3 is a schematic sectional view of an organic light emitting diode according to another embodiment of the present invention. An organic emission layer 6 includes a sequentially stacked structure of the first emission layer 61, the second emission layer 62, the third emission layer 63, a fourth emission layer 64, and a fifth emission layer 65.

In this case, each of the first emission layer 61, the third emission layer 63, and the fifth emission layer 65 includes the mixed layer that contains the host material and the dopant material. Each of the second emission layer 62 and the fourth emission layer 64 includes the host material only. Even in this case, the interval between a top surface of a first electrode 2 and a bottom surface of the second electrode 3 may be adjusted to comply with a third resonance thickness t3 that is an optical resonance thickness. Detailed descriptions of other layers have been already described with reference to FIG. 1 and thus, will not be presented herein.

As described above, according to the present invention, the thickness of the organic emission layer 6 is controllable by adding layers that contain only a host material in the middle of the organic emission layer 6. Thus, the optical resonance thickness can be controlled and a decrease in luminescent characteristics of the organic light emitting diode can be prevented.

Figure 4:
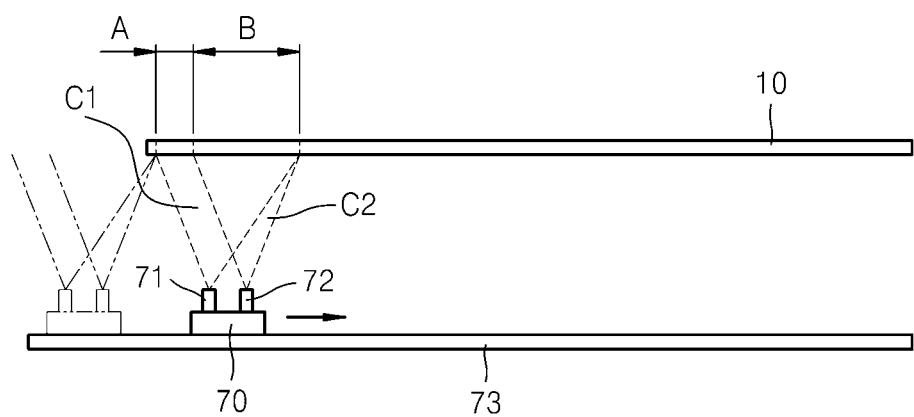
FIG. 4 is a schematic diagram of an example of a deposition apparatus performing a method of forming a thin film according to an embodiment of the present invention.

The organic emission layer 6 having such structures as described above may be formed using a deposition method illustrated in FIG. 4. FIG. 4 is a schematic diagram of an example of a deposition apparatus performing a method of forming the organic emission layer 6 according to an embodiment of the present invention. Although not illustrated in FIG. 4, all the members illustrated in FIG. 4 may be disposed in a chamber in which an appropriate degree of vacuum is maintained constant. The chamber may also be under an inert atmosphere including inert gas.

In such a chamber, a to-be-treated substrate 10 is disposed. In view of the structures illustrated in FIGS. 1 to 3, the to-be-treated substrate 10 may be a structure including the first electrode 2 and/or first organic layer 4 formed on the substrate 1. The to-be-treated substrate 10 may be a large-size substrate such as a mother glass on which a plurality of Organic light emitting diodes are formed.

Referring to FIG. 4, a first deposition source 71 and a second deposition source 72 may be disposed under the to-be-treated substrate 10. The first deposition source 71 and the second deposition source 72 face the to-be-treated substrate 10. The first deposition source 71 and the second deposition source 72 may be placed on a base 70. The base 70 is placed on a guide rail 73 in the chamber and reciprocates along the guide rail 73. Thus, the base 70 is connected to a separate driving unit (not shown) and is driven. However, in order to create the relative motion, the substrate 10 can also be moved in addition to or instead of the base 70.

As illustrated in FIG. 4, the first deposition source 71 and second deposition source 72 are separated from each other at a predetermined interval, and simultaneously move in the same direction. However, it is understood that the sources 71,72 could be independently driven so as to move in different directions.

As illustrated in FIG. 4, the first deposition source 71 discharges a first deposition material to form a first emission region C1. The first region C1 has a fan-like shape having a predetermined angle in which the first deposition source C1 deposits the first deposition material on the to-be-treated substrate 10. The second deposition source 72 discharges a second deposition material within a second emission region C2. The second emission region C2 has a fan-like shape having a predetermined angle within which the second disposition source 72 deposits the second deposition material on the to-be-treated substrate 10. In this case, the first emission region C1 and the second emission region C2 partially overlap, and thus the to-be-treated substrate 10 has a deposition region A in which only the first deposition material is deposited and a deposition region B in which the first deposition material and the second deposition material are mixed and deposited.

Figure 5:
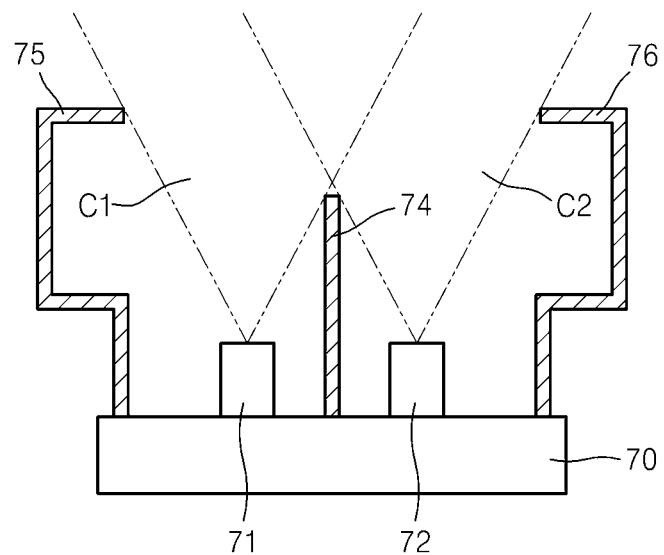
FIG. 5 is a schematic diagram for explaining deposition sources and angle limitation members with respect to the deposition sources illustrated in FIG. 4.

While other methods can be used to control the angles, the deposition angle of each of the first deposition source 71 and the second deposition source 72 may be controlled using an angle limitation member as illustrated in FIG. 5. According to an aspect of the invention, as illustrated in FIG. 5, a first angle limitation member 74 is located between the first deposition source 71 and the second deposition source 72, and a second angle limitation member 75 and a third angle limitation member 76 are disposed outside the first deposition source 71 and the second deposition source 72. The second angle limitation member 75 and the third angle limitation member 76 may extend in a direction perpendicular to a direction in which the first and second deposition sources 71 and 72 discharge the first and second deposition materials.

The shape of the first emission region C1 is dependent on a vertical length of the first angle limitation member 74 and a horizontal and/or vertical length of the second angle limitation member 75. The shape of the second emission region C2 is dependent on the vertical length of the first angle limitation member 74 and a horizontal and/or vertical length of the third angle limitation member 76. In addition, the shape of the first emission region C1 is dependent on the location of the first deposition source 71 between the first angle limitation member 74 and the second angle limitation member 75. Also, the shape of the second emission region C2 is dependent on the location of the second deposition source 72 between the first angle limitation member 74 and the third angle limitation member 76.

Accordingly, the shapes of the first emission region C1 and the second emission region C2 may be controlled as illustrated in FIG. 4 by adjusting the vertical length of the first angle limitation member 74, the horizontal and/or vertical length of the second angle limitation member 75, and the horizontal and/or vertical length of the third angle limitation member 76, the location of the first deposition source 71 between the first angle limitation member 74 and the second angle limitation member 75, and the location of the second deposition source 72 between the first angle limitation member 74 and the third angle limitation member 76. While not shown, it is understood that the angles can also be affected by the tilting of the sources 71,72 relative to the base 70.

Each of the first deposition source 71 and the second deposition source 72 may include a plurality of deposition crucibles aligned in a straight line or at least one line type crucible.

The first deposition source 71 houses a host material and deposits the host material on the to-be-treated substrate 10. The second deposition source 72 houses the dopant material and deposits the dopant material on the to-be-treated substrate 10.

Figure 6:
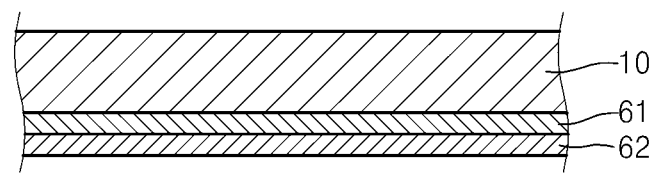
FIG. 6 is a sectional view illustrating an example of a thin film formed using the deposition apparatus illustrated in FIG. 4.

The deposition sources 71 and 72 simultaneously perform a deposition process while moving in an arrow direction illustrated in FIG. 4. In this case, the deposition sources 71 and 72 starts the deposition process from the outside a leftmost end of the to-be-treated substrate 10, and thus, the leftmost end of the to-be-treated substrate 10, the overlap region B, and the deposition region A are sequentially subjected to the deposition. Accordingly, as illustrated in FIG. 6, first, the first emission layer 61 in which a host material and a dopant material are mixed is formed by the overlap region B. Then the deposition region A passes by the same region of the to-be-treated substrate 10, and thus, the second emission layer 62 that contains only the host material is formed under the first emission layer 61.

Such sequential formation of the first emission layer 61 and the second emission layer 62 may be simultaneously formed by moving the deposition sources 71 and 72 n a direction from the leftmost to rightmost of the to-be-treated substrate 10 in FIG. 4. Thus, the deposition process is easily, quickly performed. In addition, even when the first emission layer 61 and the second emission layer 62 are simultaneously formed in a single chamber, the deposition processes are performed almost at the same time and thus there is no need to discharge the chamber between formation of the first emission layer 61 and formation of the second emission layer 62. While described in terms of left and right for the purposes of convenience, the directors are not specifically limited to left or right.

Thicknesses of the first emission layer 61 and the second emission layer 62 may be dependent on sizes of the deposition region A and the overlap region B. Thus, as illustrated in FIG. 5, the thicknesses of the first emission layer 61 and the second emission layer 62 may be dependent upon the lengths of the first angle limitation member 74 through the third angle limitation member 76 and the locations of the first deposition source 71 and the second deposition source 72.

Figure 7:
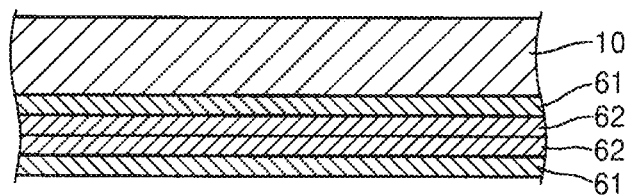
FIG. 7 is a sectional view illustrating another example of a thin film formed using the deposition apparatus illustrated in FIG. 4.

When the deposition as described above is further performed in the opposition direction to the direction in which the deposition process is performed as illustrated in FIG. 4, as illustrated in FIG. 7, a structure including the first emission layer 61, the second emission layer 62, the second emission layer 62, and the first emission layer 61, which are sequentially formed in this order, may be obtained. To obtain this structure, referring to FIG. 4, the second deposition source 72 may be moved to the outside a rightmost end of the to-be-treated substrate 10 and then moved back to the left side. By using this reciprocating method, the structure of the organic emission layer 6 illustrated in FIG. 2 may be simply formed.

After the organic emission layer 6 is formed, the second organic layer 5 and the second electrode 3 may be sequentially formed according to an aspect of the invention.

Figure 8:
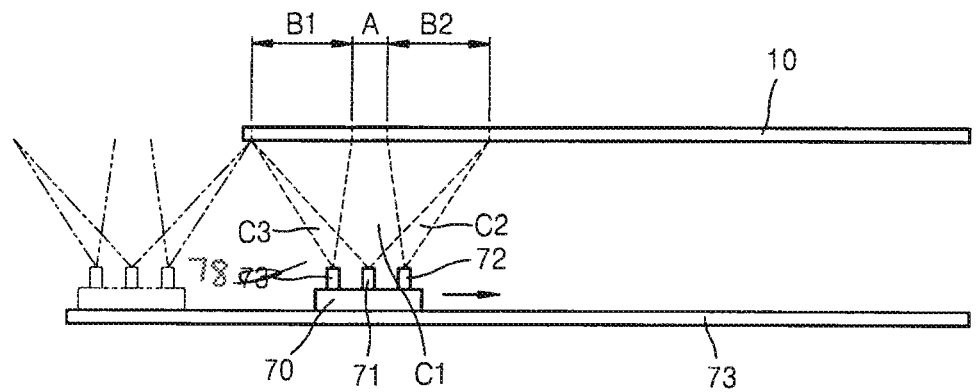
FIG. 8 is a schematic diagram of an example of a deposition apparatus performing a method of forming a thin film according to another embodiment of the present invention.

FIG. 8 is a schematic diagram of an example of a deposition apparatus performing a method of forming a thin film according to another embodiment of the present invention. Unlike the deposition apparatus illustrated in FIG. 4, the deposition apparatus illustrated in FIG. 8 includes a third deposition source 78, a first deposition source 71, and a second deposition source 72, which are arranged in this order. The third deposition source 78 and the second deposition source 72 deposit a dopant material and the first deposition source 71 deposits a host material.

In this case, a first emission region C1 and each of a second emission region C2 and a third emission region C3 may overlap. Thus, as illustrate in FIG. 8, a second overlap region B2, a deposition region A, and a first overlap region B1 are sequentially deposited in this order. Accordingly, only the host material is deposited in the deposition region A, and the host material and the dopant material are deposited in the first overlap region B1 and the second overlap region B2.

The deposition sources 71, 72, and 78 simultaneously perform a deposition process while moving in an arrow direction illustrated in FIG. 8. In this case, the deposition sources 71, 72, and 78 start a deposition process from the outside a leftmost end of the to-be-treated substrate 10, and thus, the deposition is performed on the to-be-treated substrate 10 from the leftmost end of the to-be-treated substrate 10 in such an order as the second overlap region B2, the deposition region A, and the first overlap region B1.

Figure 9:
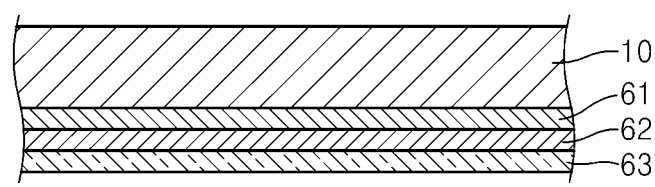
FIG. 9 is a sectional view illustrating an example of a thin film formed using the deposition apparatus illustrated in FIG. 8.

Accordingly, on a bottom surface of the to-be-treated substrate 10, as illustrated in FIG. 9, first, the first emission layer 61 including the host material and the dopant material are formed by the second overlap region B2. Subsequently, the deposition region A passes by the same region of the to-be-treated substrate 10. As a result, the second emission layer 62 including only the host material on a bottom surface of the first emission layer 61 is formed. Subsequently, the first overlap region B1 passes by the same region of the to-be-treated substrate 10, thereby forming the third emission layer 63 including the host material and the dopant material on a bottom surface of the second emission layer 62.

Such sequential formation of the first emission layer 61 through the third emission layer 63 may be simultaneously performed while the deposition sources 71, 72, and 78 move once in a direction from the leftmost to rightmost of the to-be-treated substrate 10 as illustrated in FIG. 8. Accordingly, the structure of organic emission layer 6 illustrated in FIG. 2 may be easily, quickly obtained.

Figure 10:
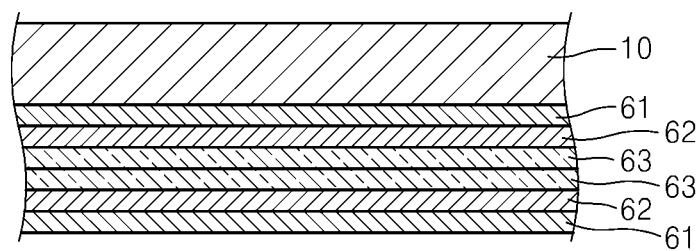
FIG. 10 is a sectional view illustrating another example of a thin film formed using the deposition apparatus illustrated in FIG. 8.

When the deposition as described above is further performed in the opposition direction to the direction in which the deposition process is performed as illustrated in FIG. 8, as illustrated in FIG. 10, a structure including the first emission layer 61, the second emission layer 62, the third emission layer 63, the third emission layer 63, the second emission layer 62, and the first emission layer 61, which are sequentially formed in this order, may be obtained. To obtain this structure, referring to FIG. 8, the third deposition source 78 be moved to the outside a rightmost end of the to-be-treated substrate 10 and then moved back to the left side.

By using this reciprocating method, the structure of the organic emission layer 6 illustrated in FIG. 3 may be simply formed.

EXAMPLE AND COMPARATIVE EXAMPLE

Organic light emitting diodes having the structure as illustrated in FIG. 2 were manufactured.

Example and Comparative Example used a green emission layer as the organic emission layer 6. The second resonance thickness t2 was about 250 nm. The first electrode 2 had a stack structure including an Ag reflective layer and an ITO layer. The second electrode 3 included Mg:Ag. The hole injection layer 41 was formed by depositing LHT-001 produced by LUDIS Co. to a thickness of 80 nm. The hole transport layer 42 was formed by depositing NPB to a thickness of 80 nm. The electron transport layer 52 was formed by depositing Alq to a thickness of 30 nm. The electron injection layer 51 was formed by depositing LiQ to a thickness of 0.5 nm.

In Example, the thickness of the first emission layer 61 was 29.5 nm, the thickness of the second emission layer 62 was 1 nm, and the thickness of third emission layer 63 was 29.5 nm. Each of the first emission layer 61 and the third emission layer 63 included the host material and the dopant material, and the second emission layer 62 included only the host material.

In Comparative Example, the entire organic emission layer was formed of the host material and the dopant material, and had a thickness of 60 nm.

The host material was ADN and the dopant material was GGD03 produced by Gracel Inc.

Table 1 shows the driving voltage, luminance, and color coordinates of the Organic light emitting diodes manufactured according to Example and Comparative Example.

TABLE 1

|  | Driving Voltage (V) | Luminance (cd/A) | X | Y |
| --- | --- | --- | --- | --- |
| Example | 4.8 | 28.4 | 0.124 | 0.743 |
| Comparative Example | 6.1 | 21.0 | 0.317 | 0.653 |

As shown in Table 1, when the same materials are used and the entire thickness of the organic emission layer 6 and the thickness of the entire organic film are the same, the organic light emitting diode manufactured according to Example had lower driving voltage, better luminance characteristics, and better color coordinate characteristics than the organic light emitting diode manufactured according to Comparative Example.

When red and blue color coordinates (CIE-x,y) are set at (0.67, 0.3) and (0.15, 0.15), respectively, the color reproduction rate of the organic light emitting diode manufactured according to Example was 98.7% and the color reproduction rate of the organic light emitting diode manufactured according to Comparative Example was 74.8%. Thus, even with respect to the color reproduction rate, the organic light emitting diode manufactured according to Example showed better characteristics than the organic light emitting diode manufactured according to Comparative Example.

Figure 11:
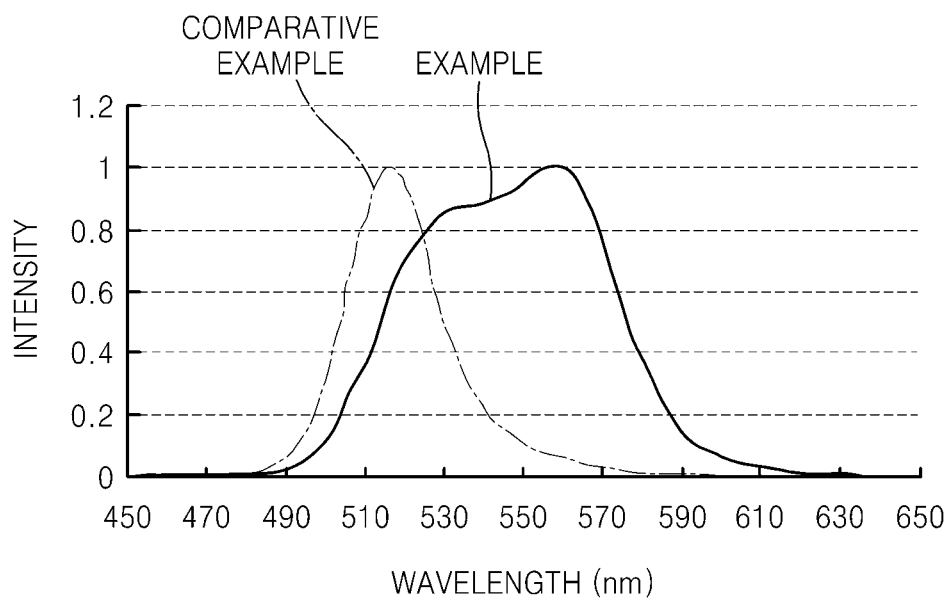
FIG. 11 is a graph illustrating spectra of Example and Comparative Example.
Figure 12:
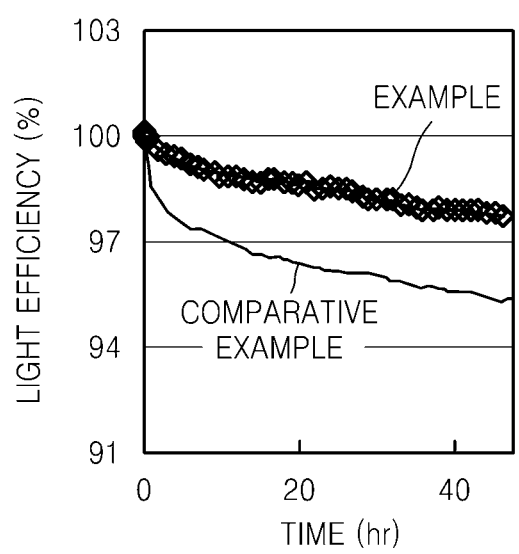
FIG. 12 is a graph of lifetime of Example and Comparative Example.

FIG. 11 is a graph illustrating spectra of Example and Comparative Example, and FIG. 12 is a graph of lifetime of Example and Comparative Example. Referring to FIG. 11, the spectrum of the organic light emitting diode manufactured according to Example has wider FWHM than the spectrum of the organic light emitting diode manufactured according to Comparative Example and thus, it can be seen that the organic light emitting diode manufactured according to Example has high white angular dependence (WAD) on the front. In general, when a device emits white and viewed on the front and side, as the spectrum thereof has wider width, a difference in luminance and color according to a viewing angle is smaller. For the organic light emitting diode manufactured according to Example, the spectrum has a wide width, and thus it can be seen that the difference in luminance and color according to a viewing angle is smaller than Comparative Example.

In addition, as illustrated in FIG. 12, the lifetime of the organic light emitting diode manufactured according to Example is lengthened.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light emitting device, the method comprising:
   preparing a substrate on which a first electrode that is reflective is disposed;
   preparing a first deposition source that discharges a host material for forming an emission layer of an organic light emitting diode toward the prepared substrate in a first deposition region, and a second deposition source that discharges a dopant material for forming an emission layer of an organic light emitting diode toward the prepared substrate in a second deposition region;
   adjusting the first deposition source and the second deposition source to form a combined deposition region, wherein the combined deposition region comprises an overlap region formed where the first deposition region and the second deposition region overlap;
   driving the first deposition source and the second deposition source to deposit the host material and the dopant material on the first electrode of the substrate, thereby forming an organic emission layer, wherein the organic emission layer comprises a first emission layer comprising a mixed layer that contains the deposited host material and the deposited dopant material, and a second emission layer comprising only the deposited host material and being stacked on the first emission layer, the first deposition source and the second deposition source simultaneously performing deposition in the respective first and second deposition regions; and
   forming a second electrode that is optically transmissible on the formed organic emission layer.

2. The method of claim 1, wherein the first deposition region comprises a portion outside of the overlap region.

3. The method of claim 1, further comprising preparing a third deposition source that discharges the dopant material in a third deposition region,
   wherein the combined deposition region further comprises:
   another overlap region formed where the first deposition region and the third deposition region overlap,
   wherein the first deposition region comprises a portion between the overlap region and the another overlap region.

4. The method of claim 1, wherein the driving of the first deposition source and the second deposition source comprises simultaneously moving the first deposition source and the second deposition source from an outside of an end of the substrate to an outside of another end of the substrate.

5. The method of claim 4, wherein the moving comprises reciprocally moving the first deposition source and the second deposition source.

6. A method of manufacturing an organic light emitting device, the method comprising:
   discharging a host material of an organic emission layer on a substrate at a first region from a first deposition source; and
   discharging a dopant material of the organic emission layer on the substrate at a second region from a second deposition source such that the first and second regions partially overlap so as to form a mixed layer of the host material and the dopant material at the overlap;
   wherein the discharging of the host material at the first region and the discharging of the dopant material at the second region are simultaneously performed while the first and second deposition sources are moved relative to the substrate so as to form another layer of only the host material stacked on the mixed layer.

7. The method of claim 6, wherein one edge of the first region and one edge of the second region align with each other, and the first region is wider than the second region such that the second region is completely contained within the first region.

8. The method of claim 6, further comprising:
   discharging the dopant material of the organic emission layer on the substrate at a third region,
   wherein the third region and the first region partially overlap.

9. The method of claim 8, wherein
   one edge of the first region and one edge of the second region align with each other,
   one edge of the third region aligns with the another edge of the first region,
   the second and third regions are completely contained within the first region, and
   a width of the first region is greater than a sum of widths of the second and third regions.

* * * * *